(12) United States Patent
Morishima et al.

(10) Patent No.: US 11,121,350 B2
(45) Date of Patent: Sep. 14, 2021

(54) ELECTRODE-ATTACHED SUBSTRATE, LAMINATED SUBSTRATE, AND ORGANIC DEVICE MANUFACTURING METHOD

(71) Applicant: SUMITOMO CHEMICAL COMPANY, LIMITED, Tokyo (JP)

(72) Inventors: Shinichi Morishima, Tsukuba (JP); Masaya Shimogawara, Niihama (JP); Eiji Kishikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/608,650

(22) PCT Filed: Apr. 20, 2018

(86) PCT No.: PCT/JP2018/016323
§ 371 (c)(1),
(2) Date: Oct. 25, 2019

(87) PCT Pub. No.: WO2018/198979
PCT Pub. Date: Nov. 1, 2018

(65) Prior Publication Data
US 2020/0144555 A1 May 7, 2020

(30) Foreign Application Priority Data
Apr. 26, 2017 (JP) .............................. JP2017-087392

(51) Int. Cl.
*H01L 51/56* (2006.01)
*H01L 51/52* (2006.01)
(Continued)

(52) U.S. Cl.
CPC .......... *H01L 51/56* (2013.01); *H01L 51/5212* (2013.01); *H01L 51/5228* (2013.01); *H01L 51/0097* (2013.01)

(58) Field of Classification Search
CPC ..... H01L 51/05; H01L 51/0097; H01L 51/50; H01L 51/56; H01L 51/5209;
(Continued)

(56) References Cited

U.S. PATENT DOCUMENTS 5,852,480 A 12/1998 Yajima et al.
6,579,422 B1 6/2003 Kakinuma
(Continued)

FOREIGN PATENT DOCUMENTS

EP 2 906 023 A1 8/2015
EP 2 914 066 A1 9/2015
(Continued)

OTHER PUBLICATIONS

International Preliminary Report on Patentability and English translation of the Written Opinion of the International Searching Authority for International Application No. PCT/JP2018/016322, dated Nov. 7, 2019.
(Continued)

*Primary Examiner* — Natalia A Gondarenko
(74) *Attorney, Agent, or Firm* — Birch, Stewart, Kolasch & Birch, LLP

(57) ABSTRACT

According to an embodiment, a substrate with an electrode is a substrate with an electrode 32 for manufacturing an organic device 10 including a first electrode 14, an organic functional layer 16, and a second electrode 18. The substrate with an electrode includes a support substrate 34, a first electrode provided on an inner side of a device formation area DA on a surface 34a of the support substrate 34, and an antistatic conductive portion 36 provided on the surface described above and electrically connected to the first electrode.

9 Claims, 10 Drawing Sheets

(51) Int. Cl.
*H01L 27/32* (2006.01)
*H01L 27/12* (2006.01)
*H01L 23/60* (2006.01)
*H01L 51/00* (2006.01)

(58) Field of Classification Search
CPC .............. H01L 51/5212; H01L 51/5225; H01L 51/5228; H01L 51/5237; H01L 21/3205; H01L 21/768; H01L 23/522; H01L 2251/5338; H01L 2251/50; H01L 2251/56; H01L 2251/566; H01L 2924/302; H01L 2924/30205; H01L 51/5203; H01L 2251/5392; H01L 2251/5361; H01L 27/3281–329; H01L 27/3297; H05B 33/02; H05B 33/10; H05B 33/14; H05B 33/26; Y02P 70/50; H05F 3/02; Y02E 10/549
USPC ................ 257/40; 313/498, 504; 445/46, 25
See application file for complete search history.

(56) References Cited

U.S. PATENT DOCUMENTS

| | | | |
|---|---|---|---|
| 6,744,120 | B1 | 6/2004 | Yanagisawa |
| 2003/0082984 | A1 | 5/2003 | Hayashi et al. |
| 2006/0214282 | A1 | 9/2006 | Sakata |
| 2006/0220541 | A1 | 10/2006 | Koyama |
| 2009/0091245 | A1* | 4/2009 | Dings ................ H01L 27/3288 313/504 |
| 2012/0252147 | A1 | 10/2012 | Takahashi et al. |
| 2012/0319570 | A1 | 12/2012 | Sugahara et al. |
| 2013/0002126 | A1* | 1/2013 | Sakaguchi .......... H01L 51/5203 313/498 |
| 2015/0255746 | A1 | 9/2015 | Osaki |
| 2015/0333112 | A1 | 11/2015 | Kamimura et al. |
| 2015/0352663 | A1 | 12/2015 | Lee et al. |
| 2019/0067626 | A1 | 2/2019 | Shimogawara et al. |
| 2019/0198807 | A1 | 6/2019 | Liu et al. |

FOREIGN PATENT DOCUMENTS

| | | |
|---|---|---|
| JP | 7-318980 A | 12/1995 |
| JP | 8-220559 A | 8/1996 |
| JP | 10-62735 A | 3/1998 |
| JP | 2003-133068 A | 5/2003 |
| JP | 2006-278213 A | 10/2006 |
| JP | 2006-294536 A | 10/2006 |
| JP | 2007-294137 A | 11/2007 |
| JP | 2008-77854 A | 4/2008 |
| JP | 2011-40336 A | 2/2011 |
| JP | 2015-215952 A | 12/2015 |
| JP | 2015-216072 A | 12/2015 |
| JP | 2016-513019 A | 5/2016 |
| JP | 2016-149223 A | 8/2016 |
| JP | 6053221 B1 | 12/2016 |
| JP | 2017-8350 A | 1/2017 |
| WO | WO 01/05194 A1 | 1/2001 |
| WO | WO 2011/070841 A1 | 6/2011 |
| WO | WO 2011/108113 A1 | 9/2011 |
| WO | WO 2013/042532 A1 | 3/2013 |
| WO | WO 2015/016082 A1 | 2/2015 |
| WO | WO 2016/136008 A1 | 9/2016 |
| WO | WO 2016/178370 A1 | 11/2016 |

OTHER PUBLICATIONS

International Search Report for International Application No. PCT/JP2018/016322, dated Jul. 17, 2018.
Japanese Office Action for Japanese Application No. 2017-086106, dated Feb. 27, 2018, with English translation.
Japanese Office Action for Japanese Application No. 2017-086106, dated Oct. 17, 2017, with English translation.
English translation of the International Search Report, dated Jul. 24, 2018, for International Application No. PCT/JP2018/016323.
International Preliminary Report on Patentability and English translation of the Written Opinion of the International Searching Authority, dated Nov. 7, 2019, for International Application No. PCT/JP2018/016323.
Japanese Office Action, dated Mar. 27, 2018, for Japanese Application No. 2017-087392, with an English translation.
Japanese Office Action, dated Nov. 7, 2017, for Japanese Application No. 2017-087392, with an English translation.
Extended European Search Report for European Application No. 18791288.6, dated Dec. 23, 2020.
Extended European Search Report for European Application No. 18791974.1, dated Dec. 22, 2020.
U.S. Office Action for U.S. Appl. No. 16/608,538, dated Feb. 4, 2021.

* cited by examiner

*Fig.10*
(a)
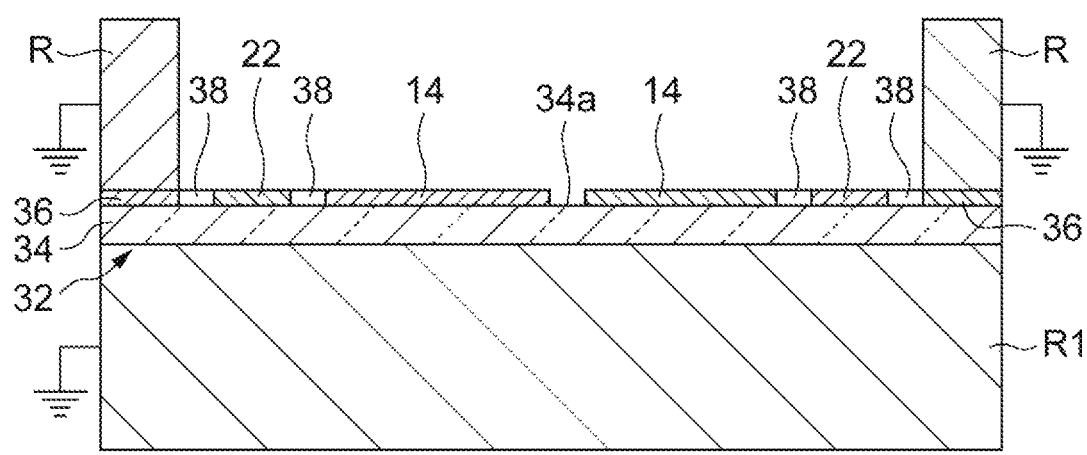
(b)
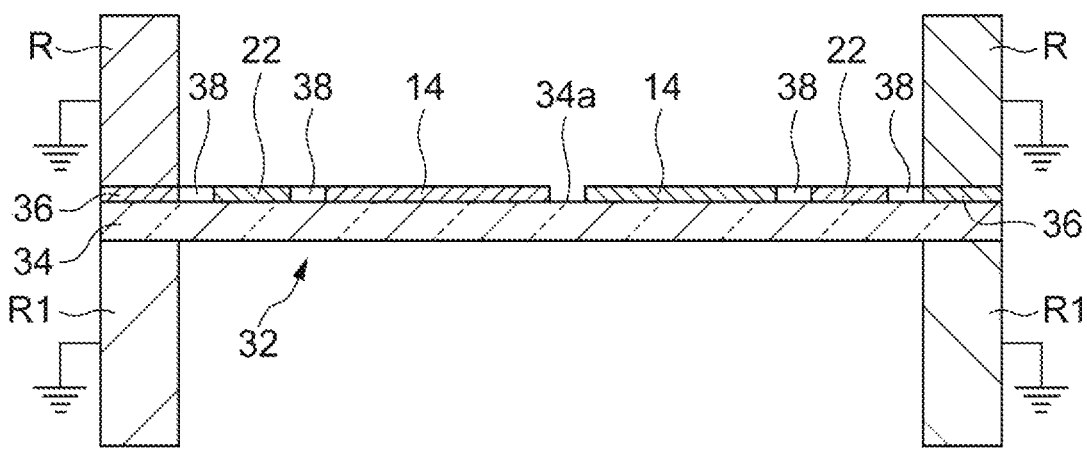

ELECTRODE-ATTACHED SUBSTRATE, LAMINATED SUBSTRATE, AND ORGANIC DEVICE MANUFACTURING METHOD

TECHNICAL FIELD

The present invention relates to a substrate with an electrode, a laminated substrate, and an organic device manufacturing method.

BACKGROUND ART

An organic device is manufactured by forming a first electrode, an organic functional layer, and a second electrode on a substrate. If a conductor such as the first electrode is formed on the substrate having insulating properties or characteristics of high electric resistance in a manufacturing process of the organic device, the substrate on which the first electrode and the like have been formed is charged by static electricity generated in the manufacturing process, in some cases. The manufacturing yield has a tendency to decrease by particle-caused defects occurring by particles and the like in an air being attracted due to a electrostatic voltage, so as to adhere onto the substrate, or by defects occurring in a structural body in the process of being manufacturing, due to an electric shock when charges staying on the substrate are discharged. Regarding this, Patent Literature 1 discloses a technology in which a conductive film is formed on a surface of a substrate, which is opposite to a surface on which a first electrode and the like are formed, and thus local accumulation of static electricity is prevented.

CITATION LIST

Patent Literature

Patent Literature 1: Japanese Patent Application Laid-Open Publication No. 2015-216072

SUMMARY OF INVENTION

Technical Problem

Even though the conductive film is formed on the surface of the substrate, which is opposite to the surface on which the first electrode and the like are formed, as in Patent Literature 1, charges are generated on the surface on which the first electrode and the like are formed. Therefore, the manufacturing yield may decrease by attracting and adhering particles and the like onto the first electrode or by causing discharge from the first electrode.

Accordingly, an object of the present invention is to provide a substrate with an electrode, a laminated substrate, and an organic device manufacturing method, in which it is possible to realize high manufacturing yield in manufacturing an organic device.

Solution to Problem

A substrate with an electrode according to an aspect of the present invention is a substrate with an electrode for manufacturing an organic device including a first electrode, a second electrode, and an organic functional layer provided between the first electrode and the second electrode. The substrate with an electrode includes a support substrate, the first electrode provided on an inner side of a device formation area on a surface of the support substrate, and an antistatic conductive portion which is provided on an outer side of the device formation area on the surface and is electrically connected to the first electrode.

With such a configuration, it is possible to manufacture the organic device in the device formation area by forming the organic functional layer and the second electrode on the first electrode provided on the inner side of the device formation area. The antistatic conductive portion electrically connected to the first electrode is provided on the surface of the support substrate in the substrate with an electrode. Thus, it is possible to prevent generation of static electricity in a manufacturing process of the organic device and charging of the substrate with an electrode due to generation of the static electricity, by manufacturing the organic device while grounding the antistatic conductive portion. As a result, since defects caused by the static electricity occur less frequently in the organic device, it is possible to realize high manufacturing yield in manufacturing the organic device.

An auxiliary electrode which is disposed on the surface to be spaced from the first electrode on the inner side of the device formation area and is to be electrically connected to the second electrode may be provided. The auxiliary electrode may be electrically connected to the antistatic conductive portion. As described above, even though the configuration in which the auxiliary electrode is provided separate from the first electrode, it is possible to prevent charging of the substrate with an electrode in the manufacturing process of the organic device since the auxiliary electrode is electrically connected to the antistatic conductive portion.

The support substrate may be a flexible substrate extending in one direction. In this case, for example, it is possible to manufacture the organic device while the substrate with an electrode is conveyed by a roll-to-roll method. Therefore, it is possible to effectively manufacture the organic device. Further, it is possible to ground the antistatic conductive portion through the roller for conveying the substrate with an electrode with the roll-to-roll method.

The antistatic conductive portion may extend in the one direction of the support substrate. In this case, for example, when the organic device is formed while the substrate with an electrode is conveyed, it is easy to ground the antistatic conductive portion, for example, by using the roller and the like which have conductivity and are grounded.

In a case of being viewed from a thickness direction of the support substrate, the first electrode and the antistatic conductive portion may be formed in different areas on the surface of the support substrate. In a case of being viewed from the thickness direction of the support substrate, the first electrode and the antistatic conductive portion may not have a portion at which the first electrode and the antistatic conductive portion overlap each other.

A laminated substrate according to another aspect of the present invention includes the substrate with an electrode according to the aspect of the present invention, the organic functional layer provided on the first electrode of, the substrate with an electrode, and a conductive layer which is provided on the organic functional layer and is electrically connected to the antistatic conductive portion.

In the laminated substrate, it is possible to manufacture the organic device by forming the second electrode, for example, by patterning the conductive layer or by further forming the second electrode on the conductive layer. In a case of manufacturing the organic device with the laminated substrate, since the conductive layer is electrically connected to the antistatic conductive portion, it is possible to prevent charging of the laminated substrate by grounding the antistatic conductive portion. Therefore, in manufacturing the organic device, it is possible to realize the high manufacturing yield.

According to still another aspect of the present invention, a method of manufacturing an organic device including the substrate with an electrode according to the aspect of the present invention, an organic functional layer, and a second electrode is provided. The method includes a step of forming the organic functional layer on the first electrode of the substrate with an electrode while the substrate with an electrode is conveyed, and a step of forming the second electrode on the organic functional layer while the substrate with an electrode is conveyed. The substrate with an electrode is conveyed while the antistatic conductive portion is grounded.

In the method, the organic functional layer and the second electrode are formed on the first electrode while the substrate with an electrode, in which the antistatic conductive portion electrically connected to the first electrode is provided, is conveyed. Thus, it is possible to manufacture the organic device in the device formation area. In manufacturing the organic device, since the substrate with an electrode is conveyed while grounding the antistatic conductive portion, charging of the substrate with an electrode in the manufacturing process of the organic device may be prevented. As a result, it is possible to realize the high manufacturing yield.

The antistatic conductive portion may be grounded by bringing a roller which has conductivity and is grounded into contact with the antistatic conductive portion of the substrate with an electrode. In this case, it is possible to ground the antistatic conductive portion without disturbing the conveyance of the substrate with an electrode and generating unnecessary particles and the like.

Advantageous Effects of Invention

According to the present invention, it is possible to provide a substrate with an electrode, a laminated substrate, and an organic device manufacturing method, in which it is possible to realize high manufacturing yield in manufacturing an organic device.

BRIEF DESCRIPTION OF DRAWINGS

FIG. 10 is a diagram illustrating another example of the disposition relationship between the substrate with an electrode and the conveying roller.

DESCRIPTION OF EMBODIMENTS

Figure 1:
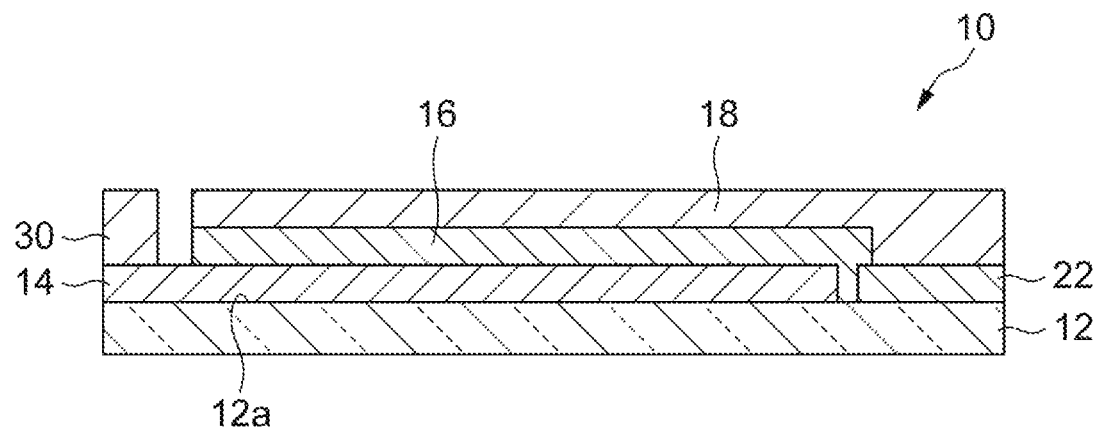
FIG. 1 is a schematic diagram illustrating a configuration of an organic EL device manufactured by a manufacturing method of an organic device according to an embodiment.

Hereinafter, an embodiment of the present invention will be described with reference to the drawings. The same components are denoted by the same reference signs, and repetitive descriptions will be omitted. It is not necessary that dimensional ratios in the drawings coincide with those in the descriptions. Examples of an organic device include an organic EL device, an organic solar cell, an organic photodetector, and an organic transistor. In the embodiment described below, the organic device is an organic EL device so long as particular statements are not made.

As illustrated in FIG. 1, an organic EL device 10 manufactured by a manufacturing method of an organic device in the embodiment includes a flexible substrate 12, an anode (first electrode) 14, a light-emitting layer (organic functional layer) 16, and a cathode (second electrode) 18. The anode 14, the light-emitting layer 16, and the cathode 18 constitute the device main body portion of the organic EL device 10. The organic EL device 10 is, for example, an organic EL lighting panel used for lighting.

The organic EL device 10 may include an auxiliary electrode 22 electrically connected to the cathode 18. The organic EL device 10 may have a bottom emission type or a top emission type. In the following descriptions, the bottom emission type organic EL device 10 including the auxiliary electrode 22 will be described so long as particular statements are not made.

Flexible Substrate

The flexible substrate 12 has translucency to visible light (light having a wavelength of 400 nm to 800 nm). The thickness of the flexible substrate 12 is 30 µm to 500 µm, for example. The flexible substrate 12 may have a film shape. In a case where the flexible substrate 12 is a resin, for example, from a viewpoint of preventing deflection, wrinkles, and elongation of the substrate when the substrate is continuously conveyed by a roll-to-roll method, the thickness of the substrate is preferably equal to or more than 45 µm. From a viewpoint of flexibility, the thickness of the substrate is preferably equal to or less than 125 µm.

The flexible substrate 12 is a plastic film, for example. Examples of the material of the flexible substrate 12 include polyether sulfone (PES); polyester resins such as polyethylene terephthalate (PET) and polyethylene naphthalate (PEN); polyolefin resins such as polyethylene (PE), polypropylene (PP), and cyclic polyolefins; polyamide resins; polycarbonate resins; polystyrene resins; polyvinyl alcohol resins; saponified ethylene-vinyl acetate copolymers; polyacrylonitrile resins; acetal resin; polyimide resins; and epoxy resins.

Among the above resins, as the material of the flexible substrate 12, polyester resins or polyolefin resins are preferable, and polyethylene terephthalate or polyethylene naphthalate is more preferable, because of high heat resistance, a low linear expansion coefficient, and low manufacturing cost. The resins may be singly used or may be used in combination of two kinds or more thereof.

The flexible substrate 12 may be thin film glass. In a case where the flexible substrate 12 is thin film glass, from a viewpoint of strength, the thickness of the flexible substrate is preferably equal to or more than 30 µm. From a viewpoint of flexibility, the thickness of the flexible substrate is preferably equal to or less than 100 µm.

The flexible substrate 12 may include a barrier layer (in particular, barrier layer that blocks moisture) that blocks a gas, moisture, and the like, on a surface 12a side. In this case, the surface of the barrier layer corresponds to the surface of the flexible substrate 12.

Anode

The anode 14 is provided on the surface 12a of the flexible substrate 12. An electrode layer having translucency is used for the anode 14. As the electrode having translucency, a thin film that contains metal oxide, metal sulfide, metal, or the like having high electric conductivity can be used. A thin film having high light transmittance is preferably used for the anode 14. For example, thin films made of indium oxide, zinc oxide, tin oxide, indium tin oxide (abbreviated as ITO), indium zinc oxide (abbreviated as IZO), gold, platinum, silver, copper, or the like are used. Among the thin films, the thin film made of ITO, IZO, or tin oxide is preferably used.

A transparent conductive film made of organic substances such as polyaniline and derivatives thereof, and polythiophene and derivatives thereof may be used as the anode 14. An electrode obtained by patterning the above-described metal, metal alloys, or the like in a mesh shape, or an electrode in which a nanowire containing silver is formed in a network shape may be used as the anode 14.

The thickness of the anode 14 can be determined considering light transmission, electric conductivity, and the like. The thickness of the anode 14 is generally 10 nm to 10 µm, preferably 20 nm to 1 and more preferably 50 nm to 200 nm.

Auxiliary Electrode

The auxiliary electrode 22 is disposed on the surface 12a of the flexible substrate 12 to be spaced from the anode 14. The auxiliary electrode 22 is electrically connected to the cathode 18. Therefore, the auxiliary electrode 22 can be considered as a portion of the cathode 18. The auxiliary electrode 22 may function as an extraction electrode of the cathode 18. The thickness and the material of the auxiliary electrode 22 may be similar to those in a case of the anode 14.

Light-Emitting Layer

The light-emitting layer 16 is disposed on a main surface (on an opposite side of a surface in contact with the flexible substrate 12) of the anode 14 and is a functional layer having a function of emitting light having a predetermined wavelength. In the embodiment, the light-emitting layer 16 is an organic functional layer that contributes to a function (that is, light emission) in the organic EL device 10. The light-emitting layer 16 is disposed such that an area in the anode 14 on an opposite side of the auxiliary electrode 22 is exposed from the light-emitting layer 16. The light-emitting layer 16 may be disposed to cover the auxiliary electrode 22 side in the anode 14. As illustrated in FIG. 1, the light-emitting layer 16 may be disposed on a portion of the auxiliary electrode 22. In this case, the light-emitting layer 16 is also disposed on the surface 12a of the flexible substrate 12.

The optimum value of the thickness of the light-emitting layer 16 varies depending on the material to be used. The thickness of the light-emitting layer 16 is appropriately set such that a driving voltage and light emission efficiency have appropriate values. The thickness of the light-emitting layer is, for example, 1 nm to 1 µm, preferably 2 nm to 500 nm, and more preferably 10 nm to 200 nm.

The light-emitting layer 16 generally contains a light emitting material that mainly emits at least one of fluorescence and phosphorescence, or the light-emitting layer 16 contains the light emitting material and a dopant material for the light-emitting layer, which is used for aiding the light emitting material. The organic substance of the light emitting material that emits at least one of fluorescence and phosphorescence may be a low molecular compound or a high molecular compound. Examples of the light emitting material include dye materials, metal complex materials, and polymer materials as follows.

(Dye Material)

Examples of the dye materials include cyclopendamine and derivatives thereof, tetraphenyl butadiene and derivatives thereof, triphenylamine and derivatives thereof, oxadiazole and derivatives thereof, pyrazoloquinoline and derivatives thereof, distyrylbenzene and derivatives thereof, distyrylarylene and derivatives thereof, pyrrole and derivatives thereof, thiophene compounds, pyridine compounds, perinone and derivatives thereof, perylene and derivatives thereof, oligothiophene and derivatives thereof, oxadiazole dimers, pyrazoline dimers, quinacridone and derivatives thereof, and coumarin and derivatives thereof.

(Metal Complex Material)

Examples of the metal complex materials can include rare earth metals such as Tb, Eu, and Dy, or a metal complex in which Al, Zn, Be, Pt, Ir, and the like are provided as central metal, and oxadiazole, thiadiazole, phenylpyridine, phenylbenzimidazole, quinoline structures, and the like are provided in a ligand. Examples of the metal complex include a metal complex such as an iridium complex and a platinum complex, which emits light from a triplet excited state, an aluminum quinolinol complex, a benzoquinolinol beryllium complex, a benzoxazolyl zinc complex, a benzothiazole zinc complex, an azomethyl zinc complex, a porphyrin zinc complex, and a phenanthroline europium complex.

(Polymer Material)

Examples of the polymer materials include polyparaphenylene vinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinylcarbazole and derivatives thereof, and materials obtained by polymerizing the dye materials or the metal complex materials.

The dopant material for the light-emitting layer is added, for example, in order to improve light emission efficiency or to change an emission wavelength. Examples of the dopant material for the light-emitting layer include perylene and derivatives thereof, coumarin and derivatives thereof, rubrene and derivatives thereof, quinacridone and derivatives thereof, squalium and derivatives thereof, porphyrin and derivatives thereof, styryl dyes, tetracene and derivatives thereof, pyrazolone and derivatives thereof, decakslen and derivatives thereof, and fenoxazone and derivatives thereof.

Cathode

The cathode 18 is disposed on a main surface (on an opposite side of a surface in contact with the anode 14 or the flexible substrate 12) of the light-emitting layer 16. The cathode 18 is also disposed on the auxiliary electrode 22. Thus, the cathode 18 and the auxiliary electrode 22 are connected to each other. In FIG. 1, the cathode 18 is provided on the entirety of the auxiliary electrode 22.

However, the cathode 18 may be disposed on a portion of the auxiliary electrode 22. The cathode 18 may have a laminated structure in which two layers or more are laminated.

As the material of the cathode 18, a material having high reflectance to light from the light-emitting layer 16 is preferable in order to causing the light from the light-emitting layer 16 to be reflected by the cathode 18 and to be directed toward the anode 14 side. As the material of the cathode 18, for example, alkali metal, alkaline earth metal, transition metal, and the Group 13 metal in the periodic table are used. Specifically, as the material of the cathode 18, for example, metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two kinds or more of the metals; alloys of one kind or more of the metals and one kind or more of gold, silver, platinum, copper, manganese, titanium, cobalt, nickel, tungsten, and tin; or graphite or graphite intercalation compounds are used. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

As the cathode 18, for example, a transparent conductive electrode made of a conductive metal oxide, a conductive organic substance, or the like may be used. Specific examples of the conductive metal oxide include indium oxide, zinc oxide, tin oxide, ITO, and IZO. Specific examples of the conductive organic substance include polyaniline and derivatives thereof, and polythiophene and derivatives thereof.

The thickness of the cathode 18 is set considering electric conductivity, durability, and the like. The thickness of the cathode 18 is generally 10 nm to 10 μm, preferably 20 nm to 1 μm, and more preferably 50 nm to 500 nm.

The organic EL device 10 may include a sealing member that seals the light-emitting layer 16. The sealing member is disposed on the top of the organic EL device 10. The sealing member seals at least the organic functional layer (light-emitting layer 16 in the embodiment) provided in the organic EL device 10. The sealing member includes a sealing base and a sticking portion.

The sealing base has a barrier function of blocking a gas, moisture, and the like, and in particular, has a moisture barrier function. Examples of the sealing base include metal foil, a barrier film in which a barrier functional layer is formed on a front surface, a back surface, or both surfaces of a transparent plastic film, flexible thin film glass, or a film in which metal having barrier properties is laminated on a plastic film. Examples of the barrier functional layer include a moisture barrier layer. As an example, the thickness of the sealing base 26 is 10 μm to 300 μm. From a viewpoint of the barrier properties, copper foil, aluminum foil, or stainless steel foil are preferable as the metal foil. In a case where the sealing base is the metal foil, it is preferable that the thickness of the metal foil increase, from a viewpoint of suppression of an occurrence of a pinhole. Considering a viewpoint of flexibility, the thickness of the metal foil is preferably 10 μm to 50 μm.

The sticking portion is provided on one surface (surface on the flexible substrate 12 side) of the sealing base. The sticking portion is used for bonding the sealing base to the anode 14, the light-emitting layer 16, and the cathode 18. The sticking portion is disposed to cover at least the light-emitting layer 16.

Specifically, the sticking portion contains a photocurable or thermosetting acrylate resin, a photocurable or thermosetting epoxy resin, or a photocurable or thermosetting polyimide resin. In addition, a resin film which can be fused by an impulse sealer which is generally used, for example, a heat fusible film such as ethylene vinyl acetate copolymers (EVA) film, a polypropylene (PP) film, a polyethylene (PE) film, and a polybutadiene (PB) film, can be used for the sticking portion. Thermoplastic resins such as vinyl acetate-based resins, polyvinyl alcohol-based resins, acrylic resins, polyethylene-based resins, epoxy resins, cellulose-based resins, cyclohexane ring-containing saturated hydrocarbon resins, and styrene-isobutylene modified resins can be used for the sticking portion. A pressure sensitive adhesive (PSA) capable of being easily attached due to adhesiveness can also be used for the sticking portion.

Hygroscopic fine particles (smaller than the thickness of an adhesive) may be contained in the adhesive used for the sticking portion. Examples of the hygroscopic fine particles include metal oxides that cause a chemical reaction with moisture at room temperature, and zeolites that physically attract moisture.

The thickness of the sticking portion is preferably 1 μm to 100 μm, more preferably 5 μm to 60 μm, and further preferably 10 μm to 30 μm. The moisture content in the sticking portion 28 is preferably equal to or less than 300 ppm (by weight).

In the organic EL device 10, in the four in which the cathode 18 is exposed or the form in which the organic EL device 10 includes the sealing member and a portion of the cathode 18 is exposed from the sealing member, a material having difficulty in being influenced by moisture (for example, transition metal oxide, aluminum, and silver) is preferable as the material of the cathode 18.

In an embodiment, as illustrated in FIG. 1, the organic EL device 10 may include a wall portion 30 which has conductivity and is provided on the anode 14. The wall portion 30 is disposed to be spaced from the cathode 18. The wall portion 30 may be formed from the same material as that of the cathode 18 and may have the same thickness as that of the cathode 18. An insulating member may be provided between the wall portion 30 and the cathode 18. In the form in which the organic EL device 10 includes the sealing member, a space between the wall portion 30 and the cathode 18 may be buried by the sticking portion, for example.

Manufacturing Method of Organic EL Device

A method of manufacturing the organic EL device 10 using a long substrate with an electrode 32 illustrated in FIG. 2 will be described. The manufacturing method of the organic EL device 10 will be described in a state where elements which are the same as or equivalent to the elements of the organic EL device 10 are denoted by the same reference signs, so long as particular statements are not made.

The substrate with an electrode 32 includes a long flexible support substrate 34. In this specification, the long support substrate 34 and the long substrate with an electrode 32 extend in one direction (the one direction of extending may be referred to as an extension direction below) and refer to the support substrate 34 and the substrate with an electrode 32 in which a length in the extension direction is longer than a length in a direction (width direction) perpendicular to the extension direction.

The support substrate 34 is a member becoming the flexible substrate 12 in the organic EL device 10. The support substrate 34 has the same configuration as that of the flexible substrate 12 except that the size of the support substrate 34 is different from the size of the flexible substrate 12. A surface 34a of the support substrate 34 corresponds to the surface 12a of the flexible substrate 12. That is, in the embodiment, the support substrate 34 is the flexible substrate 12 extending in the one direction. For example, in a form in which the flexible substrate 12 includes the above-described barrier layer, the support substrate 34 also includes a barrier layer on the surface 34a side. In this case, the surface of the barrier layer corresponds to the surface of the support substrate 34. The support substrate 34 may be a substrate that supports the elements (for example, anode 14 and antistatic conductive portion 36) to be disposed on the surface 34a of the support substrate 34.

A plurality of device formation areas DA is virtually set on the surface 34a of the support substrate 34. In the embodiment, the device formation areas DA are set to be spaced from an edge portion 34b and an edge portion 34c of the support substrate 34. The device formation area DA is an area corresponding to a product size of the organic EL device 10 to be manufactured. That is, a portion for the device formation area DA in the support substrate 34 corresponds to the flexible substrate 12 of the organic EL device 10 in FIG. 1.

Figure 2:
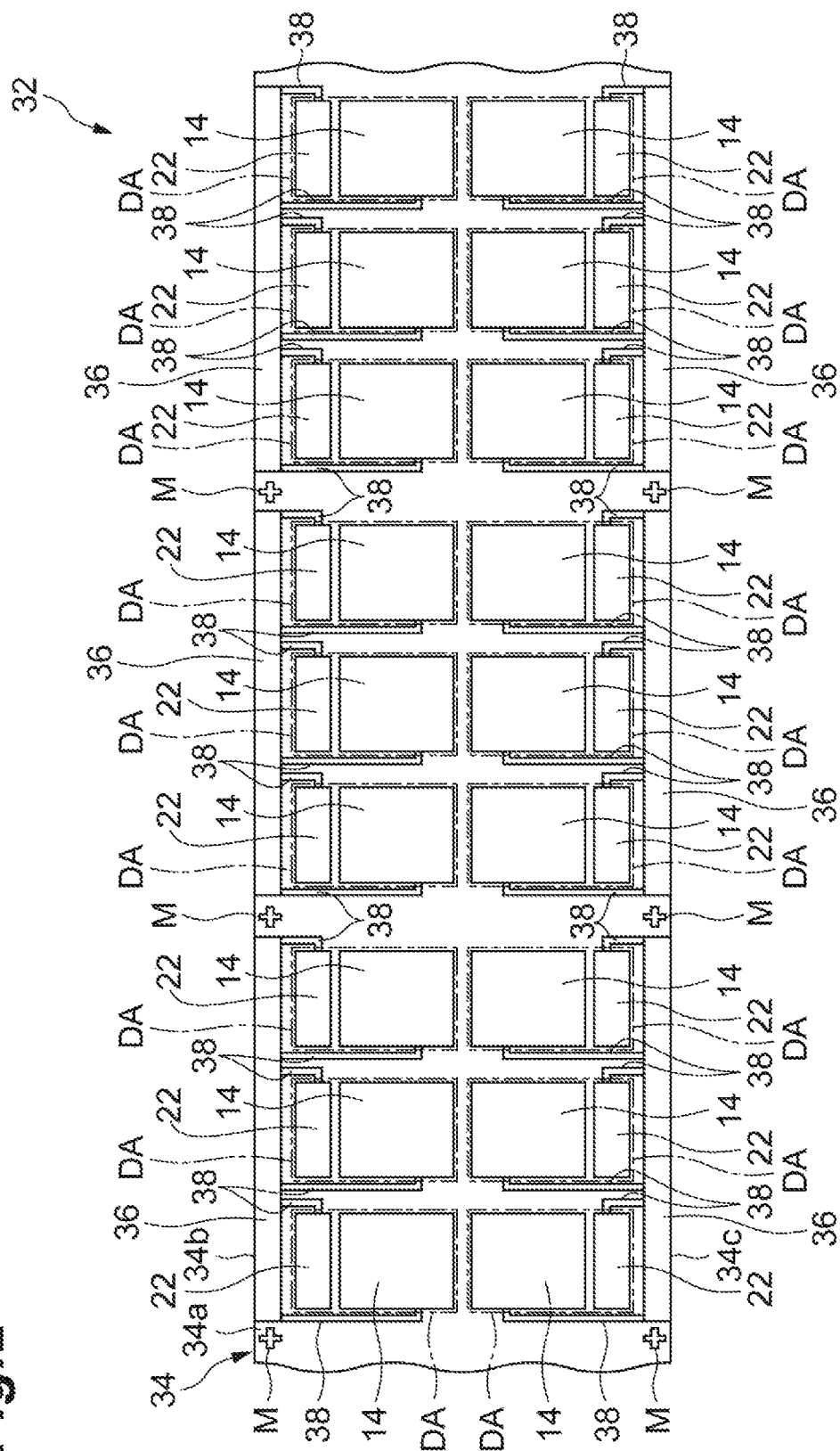
FIG. 2 is a plan view illustrating a substrate with an electrode for manufacturing the organic EL device illustrated in FIG. 1.

FIG. 2 illustrates a form in which two rows (referred to as "device formation area rows" below) configured from the plurality of device formation areas DA set to be spaced at a predetermined distance in the extension direction of the support substrate 34 are set in the width direction of the support substrate 34. However, the number of device formation area rows may be one or equal to or more than three.

A set of the anode 14 and the auxiliary electrode 22 is provided on an inner side of each of the device formation areas DA. Thus, the substrate with an electrode 32 has a plurality of sets of the anodes 14 and the auxiliary electrodes 22. The sets of the anodes 14 and the auxiliary electrodes 22 are discretely disposed.

The anode 14 may be formed by a well-known method in manufacturing the organic EL device 10. Examples of the method of forming the anode 14 include dry film formation such as a vacuum deposition method, a sputtering method, an ion plating method and a CVD method, a plating method, and a coating method. Examples of the coating method include an ink jet printing method. Any well-known coating method may be provided so long as the anode 14 can be formed with the coating method. Examples of the well-known coating method other than the ink jet printing method include a microgravure coating method, a gravure coating method, a bar coating method, a roll coating method, a wire bar coating method, a spray coating method, a screen printing method, a flexographic printing method, an offset printing method, and a nozzle printing method. An example of a method of forming the auxiliary electrode 22 is similar to the method of Ruining the anode 14.

The anode 14 and the auxiliary electrode 22 may be formed, for example, in a manner that a conductive layer is formed on the surface 34a of the support substrate 34, and then the conductive layer is patterned to patterns of the anode 14 and the auxiliary electrode 22. The anode 14 and the auxiliary electrode 22 may be directly formed by producing an individual conductive layer corresponding to the pattern of each of the anode 14 and the auxiliary electrode 22. The anode 14 and the auxiliary electrode 22 may be in contact with the surface 34a of the support substrate 34, for example.

A plurality of antistatic conductive portions 36 is formed on an outer side of the device formation area DA on the surface 34a of the support substrate 34. Specifically, a plurality of antistatic conductive portions 36 is discretely formed along the edge portion 34b. A plurality of antistatic conductive portions 36 is discretely formed along the edge portion 34c. The antistatic conductive portions 36 on the edge portion 34b side may function as a conductive portion for the device formation area row on the edge portion 34b side. The antistatic conductive portions 36 on the edge portion 34c side may function as a conductive portion for the device formation area row on the edge portion 34c side. The antistatic conductive portions 36 may be electrically connected to each other. In the embodiment, as described above, the anode 14 is formed on the inner side of the device formation area DA, and the antistatic conductive portion 36 is formed on the outer side of the device formation area DA. Thus, in a case of being viewed from the thickness direction of the support substrate 34, the anode 14 and the antistatic conductive portion 36 are formed in different areas on the surface 34a of the support substrate 34. In an embodiment, in a case of being viewed from the thickness direction of the support substrate 34, the anode 14 and the auxiliary electrode 22, and the antistatic conductive portion 36 may be formed in different areas on the surface 34a of the support substrate 34. In an embodiment, in a case of being viewed from the thickness direction of the support substrate 34, the anode 14 and the antistatic conductive portion 36 may not have a portion at which the anode and the antistatic conductive portion overlap each other. In an embodiment, in a case of being viewed from the thickness direction of the support substrate 34, the anode 14 and the auxiliary electrode 22, and the antistatic conductive portion 36 may not have a portion at which the anode 14 and the auxiliary electrode 22 overlap the antistatic conductive portion 36. In an embodiment, a bottom surface (surface on the support substrate 34 side) of the anode 14 and a bottom surface (surface on the support substrate 34 side) of the antistatic conductive portion 36 may have the substantially same position in the thickness direction of the support substrate 34. In an embodiment, the antistatic conductive portion 36 may be disposed only on the outer side of the device formation area DA. The antistatic conductive portion 36 may be in contact with the surface 34a of the support substrate 34, for example.

The antistatic conductive portion 36 has a shape extending in the extension direction of the support substrate 34. In FIG. 2, one antistatic conductive portion 36 is provided for the plurality (three in FIG. 2) of device formation areas DA in the extension direction of the support substrate 34. However, one antistatic conductive portion 36 continuing in the extension direction of the support substrate 34 may be formed for all the device formation areas DA constituting the device formation area row. One antistatic conductive portion may be formed for one device formation area DA.

The antistatic conductive portion 36 is electrically connected to the anode 14 and the auxiliary electrode 22 through a conductive connection portion 38. The materials and the thicknesses of the antistatic conductive portion 36 and the connection portion 38 may be the same as or different from those of the anode 14.

The antistatic conductive portion 36 and the connection portion 38 may be formed by a method similar to the method of forming the anode 14. For example, as described in the methods of forming the anode 14 and the auxiliary electrode 22, the antistatic conductive portion 36 and the connection portion 38 may be formed in a manner as follows. A conductive layer is formed on the surface 34a of the support substrate 34. Then, the conductive layer is patterned to patterns of the antistatic conductive portion 36 and the connection portion 38 simultaneous with a period in which the conductive layer is patterned to the patterns of the anode 14 and the auxiliary electrode 22. The antistatic conductive portion 36 and the connection portion 38 may be formed by directly producing a conductive layer corresponding to each pattern.

An alignment mark M for aligning in a manufacturing step may be formed on the surface 34a of the support substrate 34. The alignment mark M is formed on the outer side of the device formation area DA, for example. The shape of the alignment mark M is not limited to a cross shape as illustrated in FIG. 2, and other shapes such as a linear shape may be provided. The alignment mark M may be formed with the same material as that of the anode 14. The alignment mark M may be integrally formed when the anode 14 is formed, or may be formed in advance before the anode 14 is formed.

A connection state of the anode 14 and the antistatic conductive portion 36 by the connection portion 38 is not limited to the form illustrated in FIG. 2. The anode 14 and the auxiliary electrode 22 may be electrically connected to the antistatic conductive portion 36 through the connection portion 38.

Figure 3:
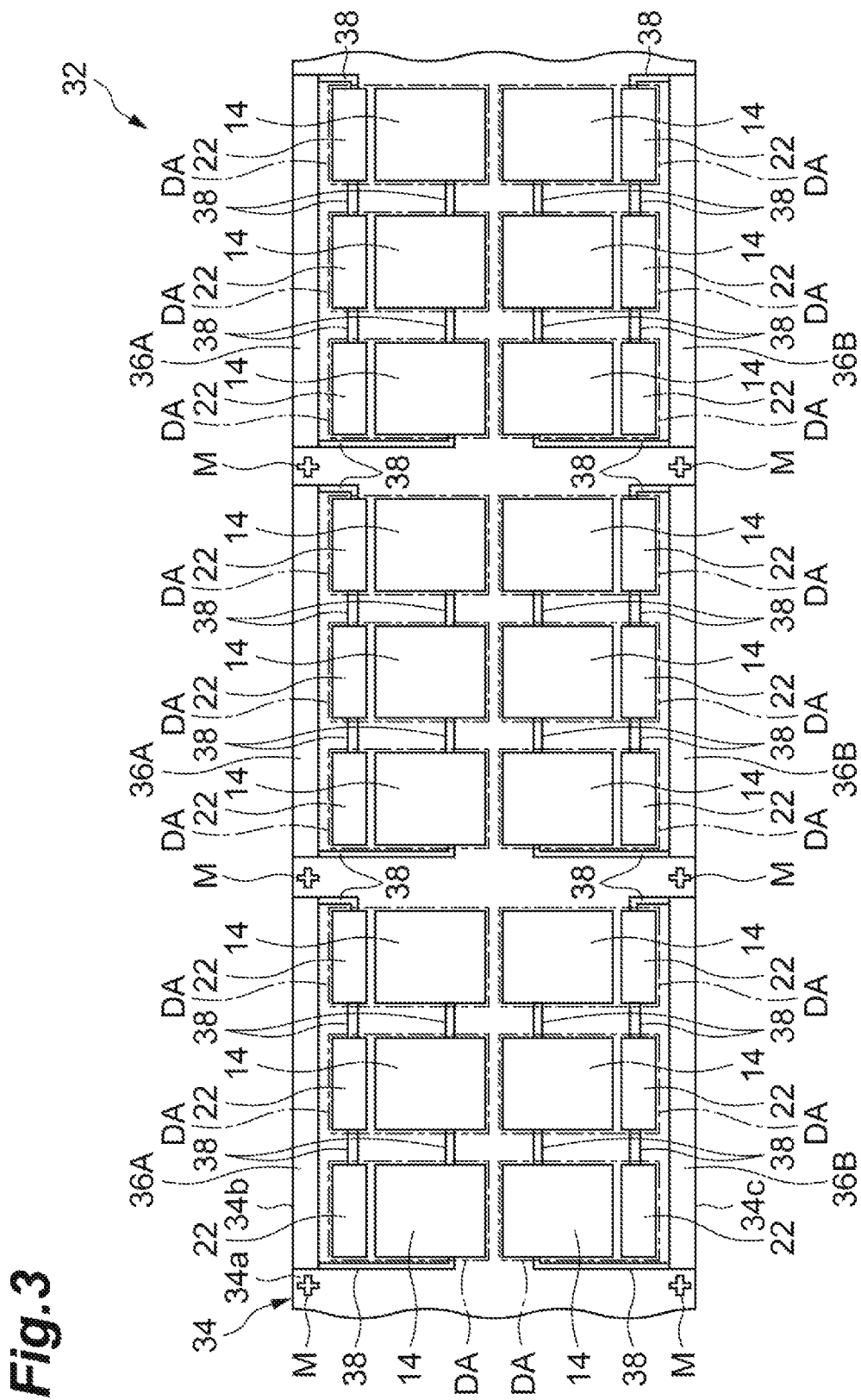
FIG. 3 is a diagram illustrating a modification example of the substrate with an electrode illustrated in FIG. 2.

For example, as illustrated in FIG. 3, one anode 14 among a plurality of anodes 14 connected by the connection portion 38 may be connected to the antistatic conductive portion 36 by the connection portion 38. The above descriptions are similarly applied to the auxiliary electrode 22.

Figure 4:
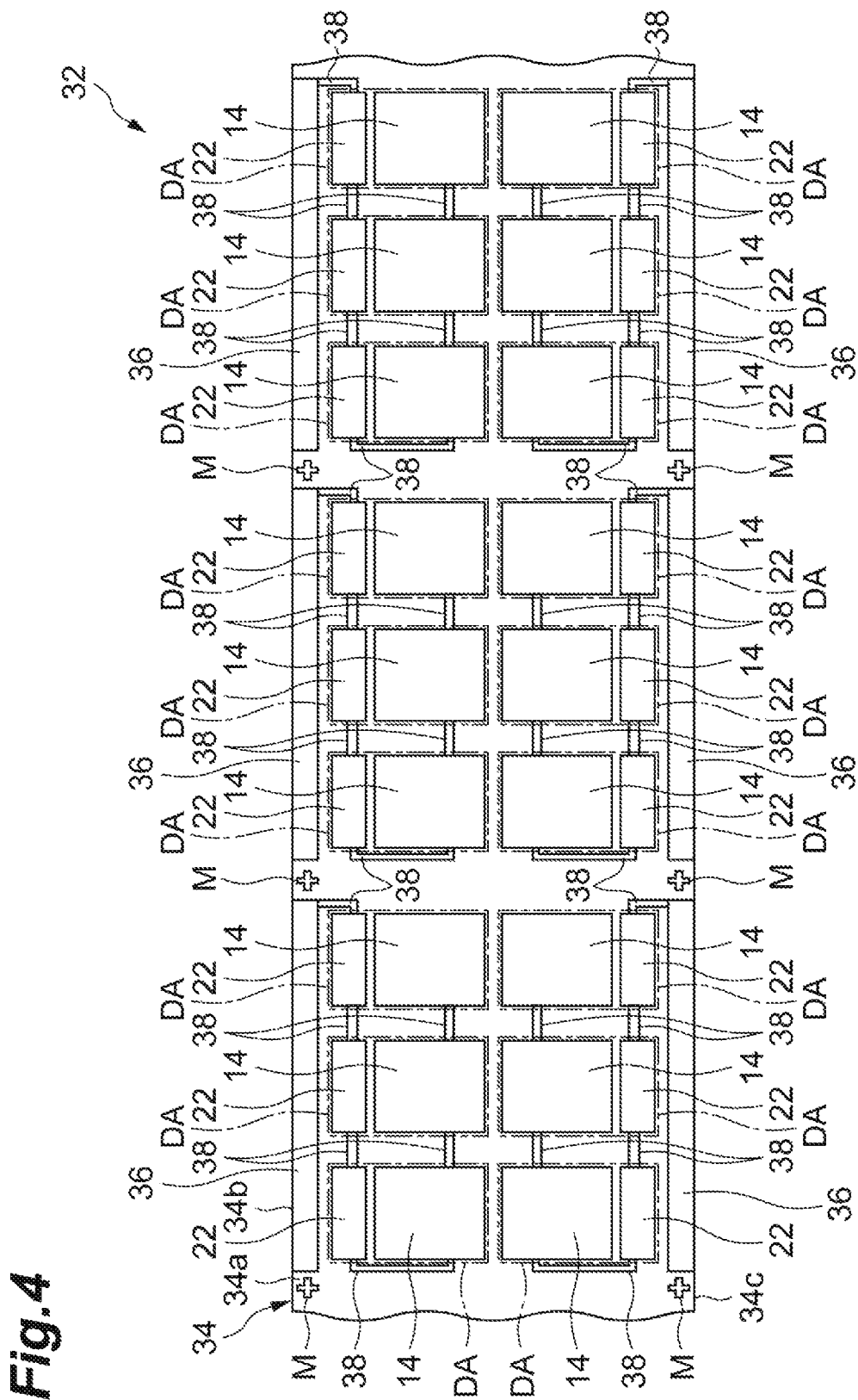
FIG. 4 is a diagram illustrating another modification example of the substrate with an electrode illustrated in FIG. 2.

As illustrated in FIG. 4, one auxiliary electrode 22 among a plurality of auxiliary electrodes 22 connected by the connection portion 38 may be connected to the antistatic conductive portion 36 by the connection portion 38, and one anode 14 among the plurality of anodes 14 connected by the connection portion 38 may be connected to one auxiliary electrode 22 among the plurality of auxiliary electrodes 22 connected by the connection portion 38, by the connection portion 38.

When the anode 14 and the auxiliary electrode 22 are connected to each other by the connection portion 38, it is preferable that the anode 14 and the auxiliary electrode 22 be connected to each other by the connection portion 38 such that the connection portion 38 detours the outer side of the device formation area DA. It is because, in this case, as described later, when the support substrate 34 is diced for each device formation area DA, the connection portion 38 that connects the anode 14 and the auxiliary electrode 22 is also diced, and insulating properties between the anode 14 and the auxiliary electrode 22 are secured.

A step in the method of manufacturing the organic EL device 10 with the substrate with an electrode 32 will be described. The method of manufacturing the organic EL device 10 includes a step (light-emitting layer forming step S1) of forming the light-emitting layer 16 and a step (cathode forming step S2) of forming the cathode 18, on the substrate with an electrode 32.

Figure 5:
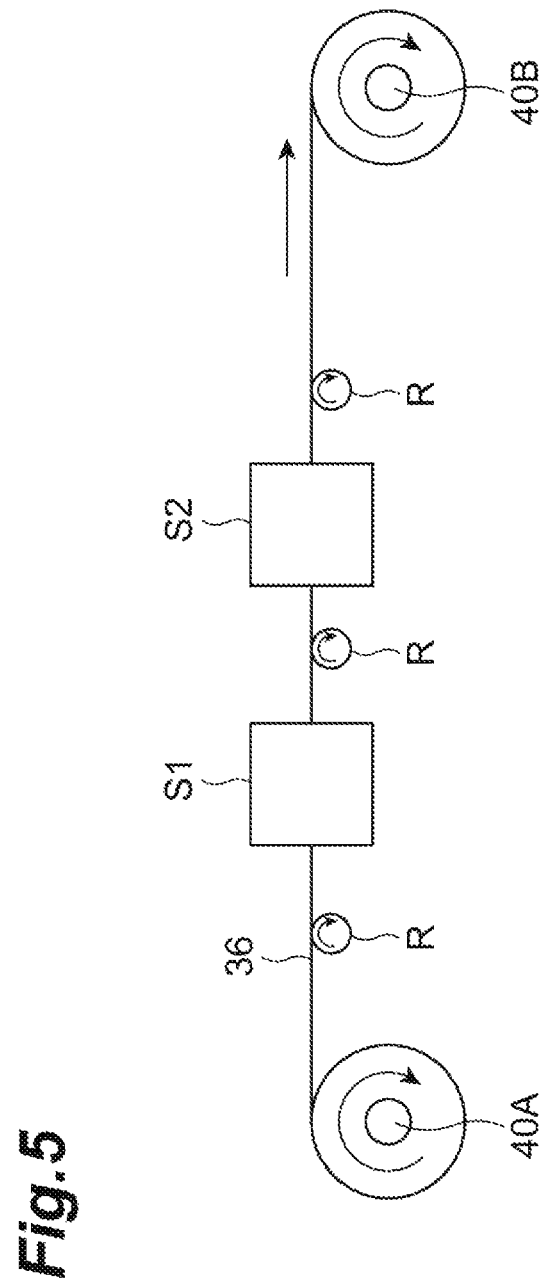
FIG. 5 is a diagram schematically illustrating a manufacturing method of the organic EL device by a roll-to-roll method.

In the embodiment, as conceptually illustrated in FIG. 5, the light-emitting layer (organic functional layer) forming step S1 and the cathode (second electrode) forming step S2 are performed by employing a roll-to-roll method. Specifically, a roll-like substrate with an electrode 32 is set on a feeding unit 40A. While the substrate with an electrode 32 is fed from the feeding unit 40A, and the substrate with an electrode 32 is conveyed toward a winding unit 40B by the conveying roller R, the light-emitting layer forming step S1 and the cathode forming step S2 are sequentially performed. Then, the substrate with an electrode 32 after the cathode forming step S2 is wound by the winding unit 40B in a roll shape. The feeding unit 40A, the winding unit 40B, and the conveying roller R constitute a portion of a conveying mechanism of the substrate with an electrode 32. In addition, the conveying mechanism may include well-known components such as a tension adjustment mechanism.

A protective film may be bonded to the roll-like substrate with an electrode 32 which is to be set on the feeding unit 40A, in order to protect the anode 14, the auxiliary electrode 22, and the like. In this case, a peeling step of peeling the protective film off may be performed in a period until the light emitting layer forming step S1 is performed after the substrate with an electrode 32 is fed from the feeding unit 40A.

Figure 6:
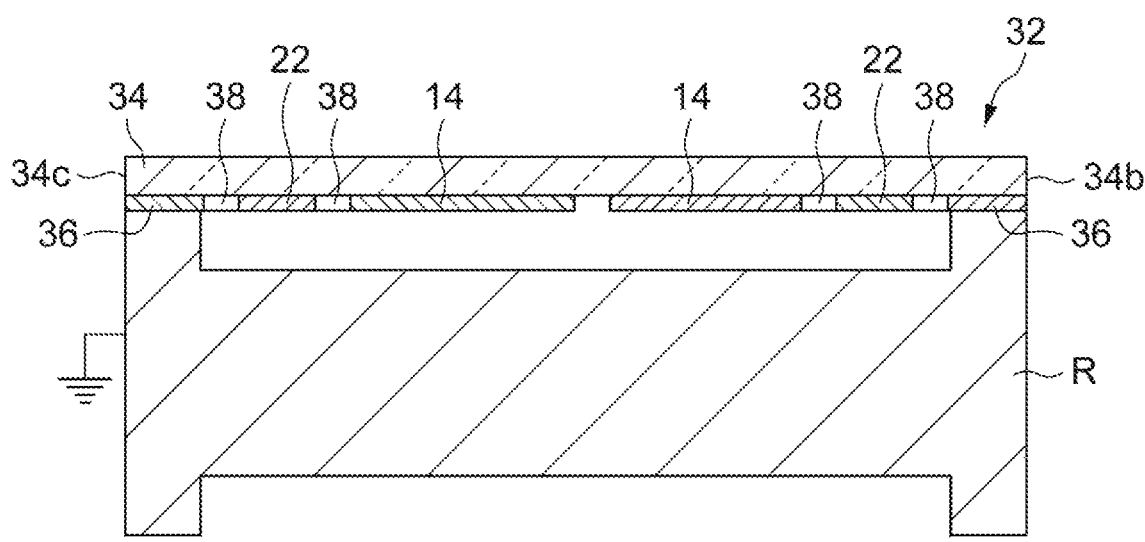
FIG. 6 is a diagram illustrating a disposition relationship between the substrate with an electrode and a conveying roller.

The conveying roller R that conveys the substrate with an electrode 32 has conductivity. For example, the conveying roller R may be configured from a conductive member. As illustrated in FIG. 6, the conveying roller R is grounded and is disposed to be in contact with the antistatic conductive portion 36 formed at each of the edge portion 34b and the edge portion 34c. Thus, the antistatic conductive portion 36 is grounded through the conveying roller R. FIG. 6 schematically illustrates a grounded state of the conveying roller R. For example, the conveying roller R can be grounded without preventing rotation of the conveying roller R, by grounding a rotation shaft (not illustrated) of the conveying roller R.

In a form in which one conveying roller R is disposed for the antistatic conductive portion 36 formed at each of the edge portion 34b and the edge portion 34c, in order to avoid an occurrence of a situation in which the element (for example, anode 14 and the light-emitting layer formed on the anode 14) in the device formation area DA comes into contact with the conveying roller R, an area (area between two antistatic conductive portions 36 in the width direction of the support substrate 34 in FIG. 6) other than an area in contact with the antistatic conductive portion 36 on a roller surface of the conveying roller R may be formed in a recess shape.

In the light-emitting layer forming step S1 and the steps subsequent to the light-emitting layer forming step S1, a point that the conveying roller R is brought into contact with the antistatic conductive portion 36, and the antistatic conductive portion 36 is grounded through the conveying roller R is similar.

FIG. 5 illustrates four conveying rollers R for convenience. However, the number of conveying rollers R is not limited to the number illustrated in FIG. 5. As illustrated in FIG. 2, in the form in which the antistatic conductive portions 36 are discretely disposed in the extension direction of the support substrate 34, a plurality of conveying rollers R may be disposed on a conveying path of the substrate with an electrode 32 such that each of the antistatic conductive portions 36 is normally in contact with the conveying roller R, for example, in a process of conveying the substrate with an electrode 32.

In FIG. 6, one conveying roller R is disposed for two antistatic conductive portions 36 disposed in the width direction of the support substrate 34. However, as illustrated in (a) and (b) of FIG. 10, independent conveying rollers R respectively corresponding to two antistatic conductive portions 36 disposed in the width direction of the support substrate 34 may be disposed. In this case, as illustrated in FIG. 10, each independent conveying roller R may be grounded.

FIG. 10 is a diagram illustrating a form in which the independent conveying rollers R respectively corresponding to the two antistatic conductive portions 36 disposed in the width direction of the support substrate 34 are disposed. (a) of FIG. 10 illustrates a state where one conveying roller R1 separate from the conveying roller R is further disposed on the surface of the support substrate 34 on an opposite side of the surface 34a. (b) of FIG. 10 illustrates a state where two conveying rollers R1 separate from the conveying roller R are further disposed on the surface of the support substrate 34 on the opposite side of the surface 34a. In FIG. 10, similar to FIG. 6, the illustration of the rotation shaft of the conveying roller R is omitted, and the grounded state of the conveying roller R is schematically illustrated. The above descriptions are similarly applied to the conveying roller R1.

For example, in a case where the conveying roller R which is independent and respectively corresponds to each of the two antistatic conductive portions 36 is disposed, the conveying roller R or the shaft of the conveying roller R is not provided in the device formation area DA of the support substrate 34. Thus, the process in each step can be performed even in a place in which the conveying roller R is disposed in the conveying path of the support substrate 34. Accordingly, this case is preferable. Further, in order to ensure installation of the antistatic conductive portion 36 and the conveying roller R, it is preferable that the antistatic conductive portion 36 be conveyed to be nipped by the conveying roller R1 which is separate from the conveying roller R. As illustrated in (a) of FIG. 10, one conveying roller R1 may be disposed for the support substrate 34. As illustrated in (b) of FIG. 10, two independent conveying rollers R1 may be disposed for the support substrate 34. The conveying roller R1 may be grounded.

The light-emitting layer forming step S1 and the cathode forming step S2 will be described below in detail.

Light-Emitting Layer Forming Step

Figure 7:
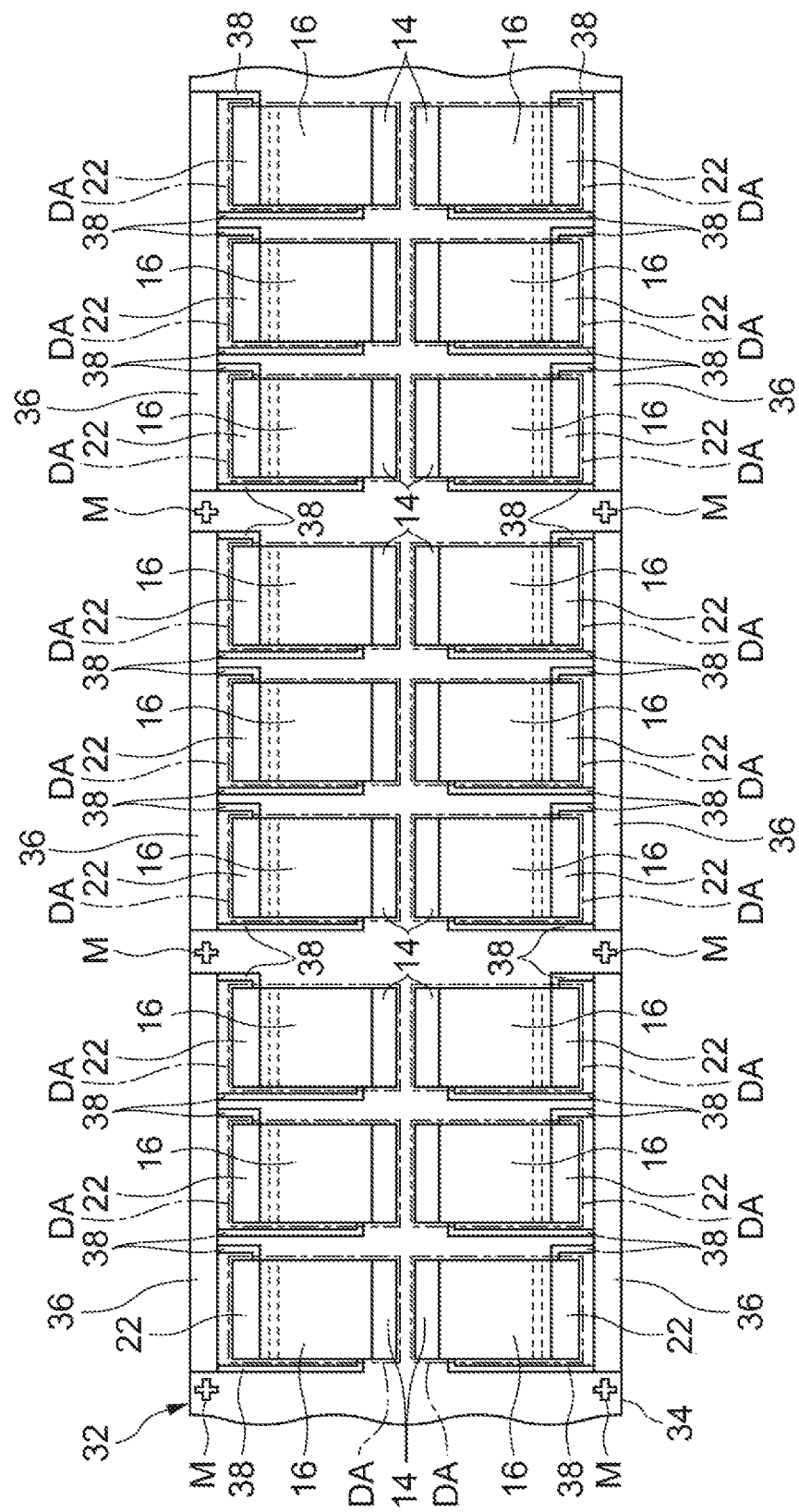
FIG. 7 is a diagram illustrating a step of forming a light-emitting layer (organic functional layer) in the manufacturing method of the organic EL device.

In the light-emitting layer forming step S1, as illustrated in FIG. 7, the light-emitting layer 16 is formed in the plurality of device formation areas DA while the substrate with an electrode 32 is conveyed. In the light-emitting layer forming step S1, the light-emitting layer 16 is formed in each of the plurality of device formation areas. The light-emitting layer 16 may be formed by using a coating method, for example. An example of the coating method may be similar to the example exemplified in the descriptions of the anode 14. The light-emitting layer 16 may be formed by a dry film formation method. Examples of the dry film formation method include a vacuum deposition method and a sputtering method. The light-emitting layer 16 may be formed in a design area (area designed for the organic EL device 10 to be manufactured) for the anode 14 and the auxiliary electrode 22 on the inner side of each of the device formation areas DA. In the light-emitting layer forming step S1, a stripe light-emitting layer 16 may be formed for each of a plurality of device formation area rows. In this case, a portion other than a light emission area may be removed.

Cathode Forming Step

In the cathode forming step S2, the cathode 18 is formed on the light-emitting layer 16. An example of the cathode forming step S2 will be specifically described.

Figure 8:
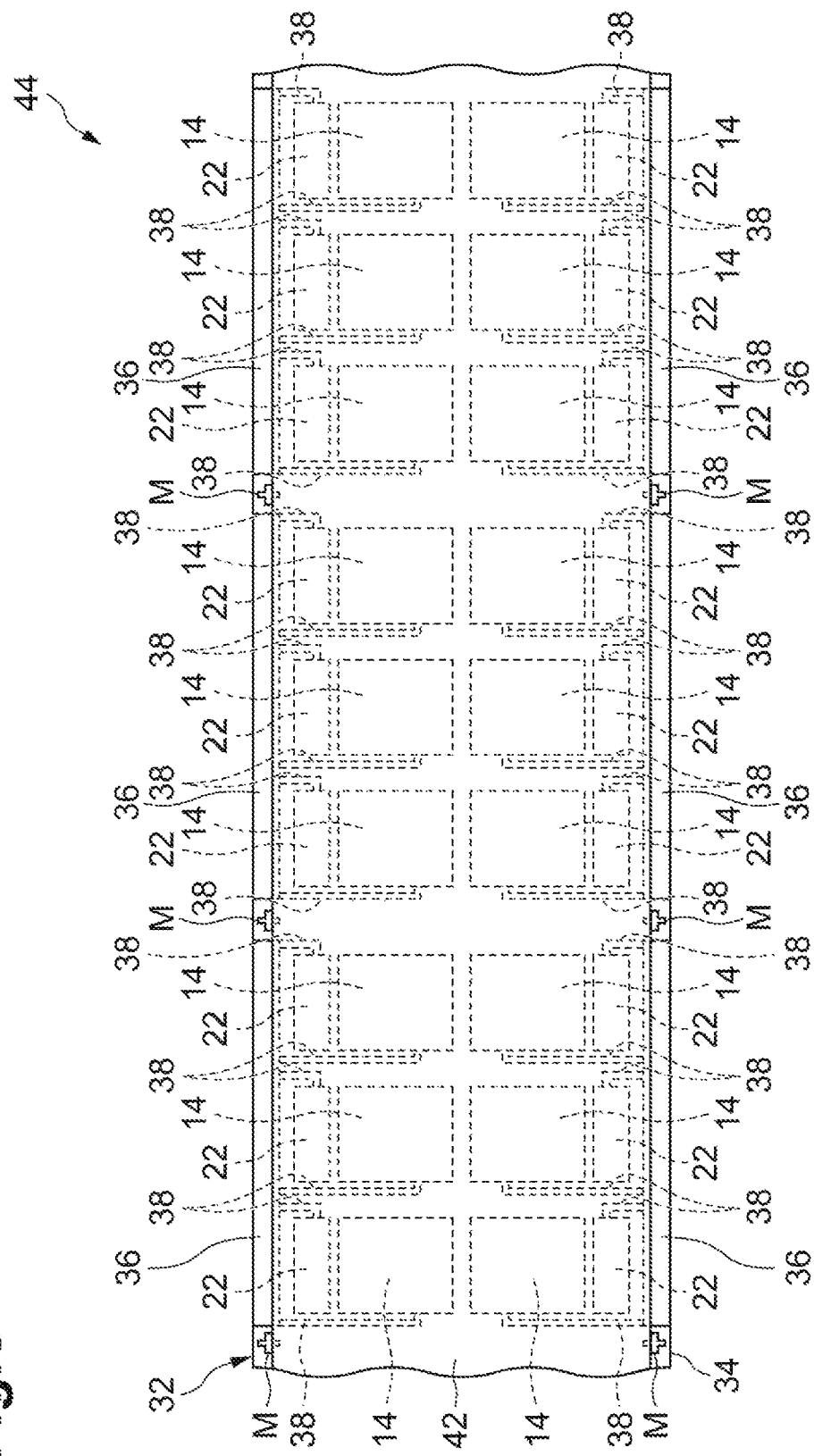
FIG. 8 is a diagram illustrating a step of forming a cathode (second electrode) in the manufacturing method of the organic EL device.

Firstly, as illustrated in FIG. 8, while the substrate with an electrode 32 is conveyed, a cathode conductive layer 42 is formed in a stripe shape over the plurality of device formation areas DA in the extension direction (longitudinal direction) of the substrate with an electrode 32 (cathode conductive layer forming step).

Examples of the method of forming the cathode conductive layer 42 include dry film formation such as a vacuum deposition method, a sputtering method, an ion plating method and a CVD method, a plating method, and a coating method. Examples of the coating method include an ink jet printing method. Any well-known coating method may be provided so long as the cathode conductive layer 42 can be formed with the coating method. Examples of the well-known coating method other than the ink jet printing method include a microgravure coating method, a gravure coating method, a bar coating method, a roll coating method, a wire bar coating method, a spray coating method, a screen printing method, a flexographic printing method, an offset printing method, and a nozzle printing method. From a viewpoint of easily exhibiting conductivity immediately after film formation, the dry film formation method is preferable. From a viewpoint that it is possible to suppress a damage of the light-emitting layer 16, the vacuum deposition method is preferable.

In the embodiment, the cathode conductive layer 42 having a width which is wider than a distance between the two antistatic conductive portions 36 provided in the width direction of the support substrate 34 is formed such that the cathode conductive layer 42 comes into contact with at least a portion of the antistatic conductive portions 36. The cathode conductive layer 42 may be formed to come into contact with the connection portion 38. Thus, the cathode conductive layer 42 and the antistatic conductive portion 36 are electrically connected to each other. Thus, the substrate with an electrode 32 in which the cathode conductive layer 42 is formed is a laminated substrate 44 including the substrate with an electrode 32, the light-emitting layer 16 being an organic functional layer provided on the anode 14 of the substrate with an electrode 32, and the cathode conductive layer 42 which is provided on the light-emitting layer 16 and is electrically connected to the antistatic conductive portion 36. A step subsequent to the cathode conductive layer forming step corresponds to a step of manufacturing the organic EL device 10 with the laminated substrate 44.

FIG. 8 illustrates an example in which the cathode conductive layer 42 is formed to expose a portion of the antistatic conductive portion 36 from the cathode conductive layer 42. The cathode conductive layer 42 may be formed to cover the entirety of the antistatic conductive portion 36. The cathode conductive layer 42 may not be disposed on the antistatic conductive portion 36. Even in this case, for example, if the cathode conductive layer 42 is formed in a stripe shape over the plurality of device formation areas DA, and the cathode conductive layer 42 is disposed on the connection portion 38 which is not covered by the light-emitting layer 16, the cathode conductive layer 42 and the antistatic conductive portion 36 are electrically connected to each other.

The cathode conductive layer 42 may be formed in the design area for the anode 14 and the auxiliary electrode 22 on the inner side of each of the device formation areas DA. For example, the cathode conductive layer 42 may be formed to cover the light-emitting layer 16 and to be located on the auxiliary electrode 22, in the device formation area DA. Thus, for example, the stripe-like cathode conductive layer 42 may be formed for each device formation area row.

Figure 9:
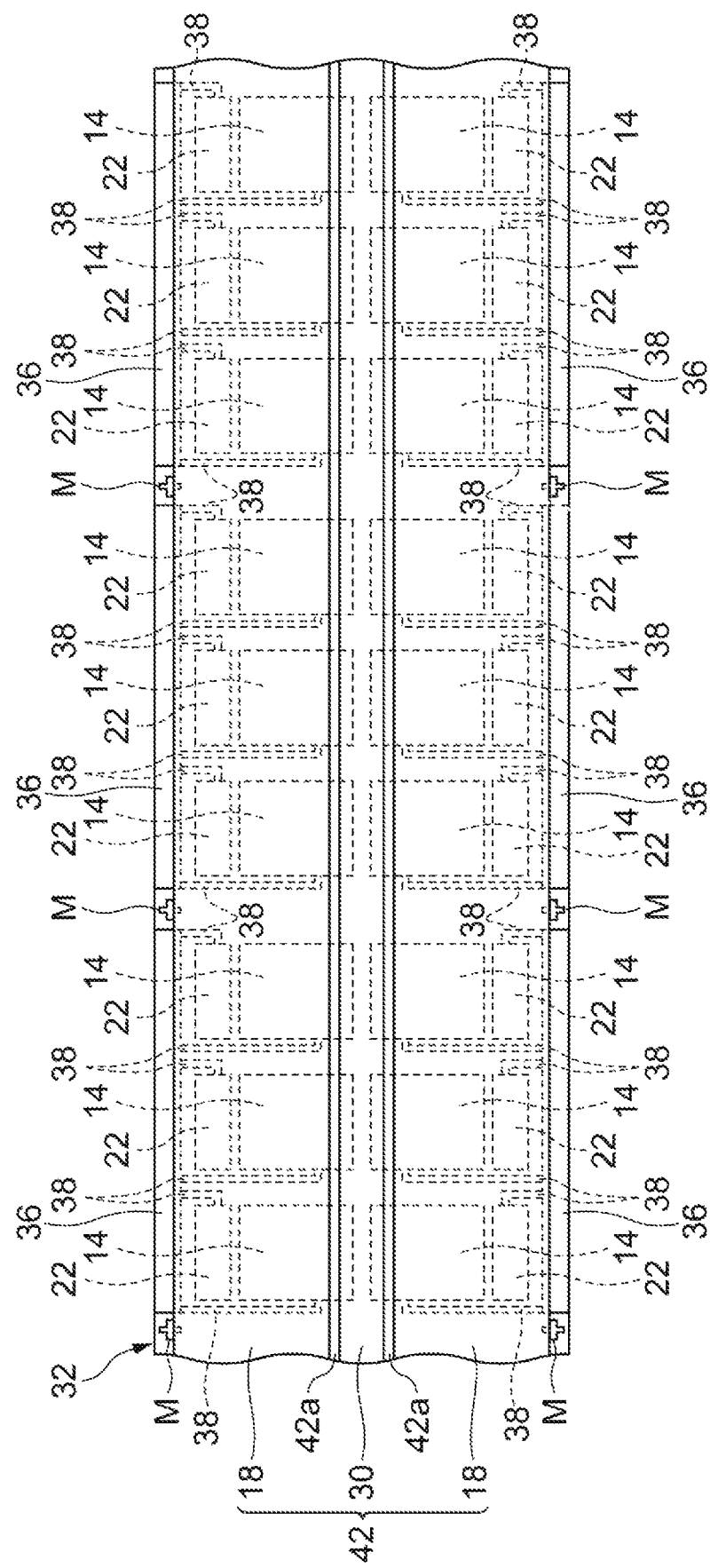
FIG. 9 is a diagram illustrating the step of forming the cathode (second electrode) in the manufacturing method of the organic EL device.

As illustrated in FIG. 9, the cathode conductive layer 42 is patterned (patterning step). The cathode 18 is obtained by performing the patterning step. In a form illustrated in FIG. 9, a hole portion 42a which penetrates the cathode conductive layer 42 and extends in the extension direction of the support substrate 34 is formed in the cathode conductive layer 42, and the cathode conductive layer 42 is divided into the cathode 18 and the wall portion 30. Thus, the hole portion 42a corresponds to the space between the cathode 18 and the wall portion 30 in FIG. 1. In a form in which the cathode conductive layer 42 is patterned by forming such a hole portion 42a, the cathode 18 and the wall portion 30 have a stripe shape at a time point at which the patterning step ends.

A method of forming the hole portion 42a is not limited, and a method using a laser processing technology, for example, is exemplified. The hole portion 42a may be formed to insulate and separate the cathode 18 and the anode 14. Patterning in the patterning step is not limited to the form illustrated in FIG. 9 and may be performed in accordance with the shape of the cathode 18 required by the organic EL device 10.

The organic EL device 10 illustrated in FIG. 1 is formed in the substrate with an electrode 32 after the cathode forming step S2, for each device formation area DA. Thus, the manufacturing method of the organic EL device 10 may include a dicing step in which the substrate with an electrode 32 after the cathode forming step S2 is diced for each device formation area DA, and thus the organic EL device 10 having a product size is obtained. The dicing step may be performed by cutting the device formation area DA while the substrate with an electrode 32 is continuously conveyed, after the cathode forming step S2. Alternatively, the dicing step may be performed in a manner that the substrate with an electrode 32 is wound by the winding unit 40B in a roll shape, and then the roll-like substrate with an electrode 32 is set on another feeding unit, and the device formation area DA is cut out while the substrate with an electrode 32 is fed again and continuously conveyed. It is preferable that the conveying method of the substrate with an electrode 32 in the dicing step be similar to a conveying method until a bonding step S3. That is, it is preferable that the substrate with an electrode 32 be conveyed while the antistatic conductive portion 36 is grounded by the conveying roller R.

In a case of manufacturing the organic EL device 10 including the sealing member, a step (referred to as "the bonding step" below) of bonding the sealing member to the substrate with an electrode 32 after the cathode forming step S2 may be provided. In the bonding step, while the substrate with an electrode 32 after the cathode forming step S2 is conveyed in the extension direction, the long sealing member for each of the plurality of device formation area rows is continuously bonded to the substrate with an electrode 32. Alternatively, the sealing member which has been diced in advance is continuously bonded to the substrate with an electrode 32. In the form in which the manufacturing method of the organic EL device 10 includes the dicing step, generally, the bonding step may be performed before the dicing step.

Next, advantageous effects of the method of manufacturing the organic EL device 10 using the substrate with an electrode 32 will be described.

As illustrated in FIG. 2, the antistatic conductive portion 36 is for lied on the surface 34a of the support substrate 34 which is provided in the substrate with an electrode 32 and is to be the flexible substrate 12. As illustrated in FIG. 6, when the substrate with an electrode 32 is conveyed, the antistatic conductive portion 36 is grounded by bringing the conveying roller R which has conductivity and is grounded into contact with the antistatic conductive portion 36. Since the anode 14 and the auxiliary electrode 22 are electrically connected to the antistatic conductive portion 36, the anode 14 and the auxiliary electrode 22 are also grounded through the antistatic conductive portion 36 and the conveying roller R.

In a case where the substrate with an electrode does not include the antistatic conductive portion, static electricity may be generated between the conveying roller and the substrate with an electrode when the substrate with an electrode comes into contact with or is separated from the conveying roller in a conveying process of the substrate with an electrode. As described above, when a protective sheet is bonded to the substrate with an electrode and the protective sheet is peeled from the substrate with an electrode, the static electricity may be generated between the protective sheet and the substrate with an electrode. If the substrate with an electrode is charged due to such static electricity, particles in an air are attracted, and thus defects may occur in the organic device. In addition, the substrate with an electrode, and the layers and the like formed on the substrate with an electrode may be broken by the static electricity, and thus defects may occur in the organic EL device. If such defects occur, the manufacturing yield of the organic EL device decreases.

On the contrary, if the substrate with an electrode 32 including the antistatic conductive portion 36 is used, it is possible to ground the anode 14 and the auxiliary electrode 22 through the antistatic conductive portion 36, and thus charges of the substrate with an electrode 32 in the manufacturing process are erased. Thus, since the above-described defects caused by static electricity occur less frequently in the manufacturing process of the organic EL device 10, it is possible to realize high manufacturing yield.

As a method of erasing the charges of the substrate with an electrode 32, for example, a method using an ionizer and a method using an erasing wire (brush) are considered. However, the ionizer has a problem in that a charge erasing effect easily depends on the surrounding environment, for example, the charge erasing effect is low under vacuum and in a nitrogen atmosphere, and ozone is generated under the atmosphere. In a case using the erasing wire (brush), particles may be generated from the erasing wire (brush), and thus defects may occur in the organic EL device 10.

On the contrary, in the manufacturing method of the organic EL device 10, the antistatic conductive portions 36 are provided on the surface 34a of the support substrate 34, and the antistatic conductive portions 36 are grounded, and thereby charges of the substrate with an electrode 32 are erased. Therefore, charge erasing of the substrate with an electrode 32 is effectively performed without being influenced by the surrounding environment and without generating ozone. Further, the antistatic conductive portion 36 is grounded by using the conveying roller R for conveying the substrate with an electrode 32. Therefore, there is no concern of generating particles, and thus it is possible to prevent an occurrence of defects caused by the particles. As a result, it is possible to realize the high manufacturing yield.

Similar to the anode 14, the antistatic conductive portion 36 is disposed on the surface 34a of the support substrate 34. Thus, the generation of static electricity is effectively suppressed. Therefore, it is easy to realize the high manufacturing yield. Since the antistatic conductive portion 36 is formed on the same surface 34a as the surface for the anode 14 in the support substrate 34, it is possible to form the antistatic conductive portion 36 together when the anode 14 is formed. Therefore, it is easy to manufacture the substrate with an electrode 32.

The antistatic conductive portion 36 is formed on the outer side of the device formation area DA. Thus, even though scratches or the like occur on the antistatic conductive portion 36 when the antistatic conductive portion 36 is grounded, there is no influence on performance of the organic EL device 10.

As illustrated in FIG. 8, in the faun in which the cathode conductive layer 42 is formed to be disposed on the antistatic conductive portion 36, the cathode conductive layer 42 is also grounded through the antistatic conductive portion 36 and the conveying roller R. Therefore, the laminated substrate configured by laminating the cathode conductive layer 42 on the substrate with an electrode 32 through the light-emitting layer 16 being the organic functional layer is not charged. As a result, even in the subsequent steps of the cathode conductive layer forming step, defects caused by charging occur less frequently, and it is possible to suppress decrease of the manufacturing yield of the organic EL device 10.

The present invention is not limited to the described various embodiments and modification example, and is shown by the claims, and it is intended that all changes within the meaning and the range equivalent to the claims are included.

In the embodiment, a case where the organic functional layer disposed between the anode and the cathode is the light-emitting layer is described. The organic functional layer may be a functional unit that contributes to light emission of the organic EL device, such as moving of charges and recombination of charges, in accordance with power (for example, voltage) applied to the anode and the cathode. Thus, the organic functional layer may include various functional layers in addition to the light-emitting layer. For example, a hole injection layer, a hole transport layer, and the like are exemplified as the functional layer disposed between the anode and the light-emitting layer. An electron transport layer, an electron injection layer, and the like are exemplified as the functional layer disposed between the light-emitting layer and the cathode.

As a configuration example of the organic functional layer, configurations as follows are exemplified. In the following configuration example, the anode and the cathode are described for easy descriptions.

(a) (Anode)/light-emitting layer/(cathode)

(b) (Anode)/hole injection layer/light-emitting layer/(cathode)

(c) (Anode)/hole injection layer/light-emitting layer/electron injection layer/(cathode)

(d) (Anode)/hole injection layer/light-emitting layer/electron transport layer/electron injection layer/(cathode)

(e) (Anode)/hole injection layer/hole transport layer/light-emitting layer/(cathode)

(t) (Anode)/hole injection layer/hole transport layer/light-emitting layer/electron injection layer/(cathode)

(g) (Anode)/hole injection layer/hole transport layer/light-emitting layer/electron transport layer/electron injection layer/(cathode)

(h)(Anode)/light-emitting layer/electron injection layer/(cathode)

(i)(Anode)/light-emitting layer/electron transport layer/electron injection layer/(cathode)

The symbol "/" indicates that the layers sandwiching the symbol "/" are stacked adjacent to each other. The configuration of the configuration example (a) corresponds to the configuration illustrated in FIG. 1.

The hole injection layer is a functional layer having a function of improving hole injection efficiency from the anode to the light-emitting layer. The thickness of the hole injection layer is appropriately set in consideration of electrical characteristics, easiness of film formation, and the like. The thickness of the hole injection layer is, for example, 1 nm to 1 preferably 2 nm to 500 nm, and more preferably 5 nm to 200 nm.

Well-known hole injection materials may be used as the material of the hole injection layer. Examples of the hole injection material include oxide such as vanadium oxide, molybdenum oxide, ruthenium oxide and aluminum oxide, and polythiophene derivatives such as phenylamine compounds, starburst type amine compounds, phthalocyanine compounds, amorphous carbon, polyaniline and polyethylenedioxythiophene (PEDOT).

The hole transport layer is a functional layer having a function of improving hole injection efficiency to the light-emitting layer from the anode, the hole injection layer, or a portion of the hole transport layer which is closer to the anode. The thickness of the hole transport layer is appropriately set in consideration of electrical characteristics, easiness of film formation, and the like. The thickness of the hole transport layer is, for example, 1 nm to 1 $\mu$m, preferably 2 nm to 500 nm, and more preferably 5 nm to 200 nm.

Well-known hole transport materials may be used as the material of the hole transport layer. Examples of the material of the hole transport layer include polyvinylcarbazole or derivatives thereof, polysilane or derivatives thereof, polysiloxane having aromatic amine in a side chain or a main chain or derivatives thereof, pyrazoline or derivatives thereof, aryl amines or derivatives thereof, stilbene or derivatives thereof, triphenyldiamine or derivatives thereof, polyaniline or derivatives thereof, polythiophene or derivatives thereof, polyarylamine or derivatives thereof, polypyrrole or derivatives thereof, polyp-phenylene vinylene) or derivatives thereof, or poly(2,5-thienylenevinylene) or derivatives. Examples of the material of the hole transport layer include a hole transport material disclosed in Japanese Patent Application Laid-Open Publication No. 2012-144722.

The electron transport layer is a functional layer having a function of improving electron injection efficiency to the light-emitting layer from the cathode, the electron injection layer, or a portion of the electron transport layer which is closer to the cathode. The thickness of the electron transport layer is appropriately set in consideration of electrical characteristics, easiness of film formation, and the like. The thickness of the electron transport layer is, for example, 1 nm to 1 $\mu$m, preferably 2 nm to 500 nm, and more preferably 5 nm to 200 nm.

Well-known materials may be used as an electron transport material forming the electron transport layer. Examples of the electron transport material forming the electron transport layer include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyano ethylene or derivatives thereof, diphenoquinone derivatives, a metal complex of 8-hydroxyquinoline or derivatives thereof, polyquinoline or derivatives thereof, polyquinoxaline or derivatives thereof, and polyfluorene or derivatives thereof.

The electron injection layer is a functional layer having a function of improving electron injection efficiency from the cathode to the light-emitting layer. The thickness of the electron injection layer has an optimum value varying depending on the material to be used and is appropriately set in consideration of electrical characteristics, easiness of film formation, and the like. The thickness of the electron injection layer is, for example, 1 nm to 1 $\mu$m.

Well-known electron injection materials may be used as the material of the electron injection layer. Examples of the material of the electron injection layer include alkali metal, alkaline earth metal, alloys containing one or more of alkali metal and alkaline earth metal, oxide of alkali metal or alkaline earth metal, halide, carbonate, or mixtures of the above substances. In addition, a layer in which an organic material which has been known in the related art and has an electron transport property and an organic metal complex of alkali metal are mixed can be used as the electron injection layer.

Examples of methods of forming the hole injection layer, the hole transport layer, the electron transport layer, and the electron injection layer include dry film formation such as a vacuum deposition method, a sputtering method, an ion plating method and a CVD method, a plating method, and a coating method. Examples of the coating method include an ink jet printing method. Any well-known coating method may be provided so long as the layers can be formed with the coating method. Examples of the well-known coating method other than the ink jet printing method include a microgravure coating method, a gravure coating method, a bar coating method, a roll coating method, a wire bar coating method, a spray coating method, a screen printing method, a flexographic printing method, an offset printing method, and a nozzle printing method.

As described above, the hole transport layer and the electron transport layer may be organic layers containing organic materials. The hole injection layer and the electron injection layer may be formed as inorganic layers or as organic layers containing organic materials.

The anode is exemplified as a first electrode, and the cathode is exemplified as a second electrode. However, the first electrode may be the cathode, and the second electrode may be the anode. That is, the cathode may be disposed on the support substrate (flexible substrate) side.

The number of antistatic conductive portions in the width direction of the support substrate is not limited to two. That is, the embodiment is not limited to a form in which the antistatic conductive portion is provided at each of both edge portions in the width direction of the support substrate. For example, only one antistatic conductive portion may be provided, or three or more antistatic conductive portions may be provided in the width direction of the support substrate.

In a case where a plurality of first electrodes is provided on the support substrate in a form in which the number of antistatic conductive portions in the width direction of the support substrate is one, at least one first electrode may be connected to the antistatic conductive portion while the plurality of first electrodes is electrically connected to each other with a connection portion having conductivity. In a case where an auxiliary electrode is provided to correspond to each of the first electrode, at least one first electrode or auxiliary electrode may be connected to the antistatic conductive portion while the plurality of first electrodes and a plurality of auxiliary electrodes are electrically connected to each other by connection portions having conductivity.

In a form in which the number of antistatic conductive portions in the width direction of the support substrate is three or more, for example, the antistatic conductive portion may be provided at both the edge portions of the support substrate in the width direction and be provided between the edge portions. For example, in a case where three or more device formation area rows are set, the antistatic conductive portion may be set between the device formation area rows adjacent to each other in the width direction of the support substrate.

In the embodiment, a case where the conductive layer is a cathode conductive layer is exemplified as a laminated substrate in which the organic functional layer and the conductive layer electrically connected to the antistatic conductive portion are sequentially laminated on the substrate with an electrode. However, the conductive layer which is laminated on the substrate with an electrode and is electrically connected to the antistatic conductive portion is not limited to the cathode conductive layer. For example, in a case where the organic EL device includes the electron injection layer, the conductive layer to become the electron injection layer may be disposed on the antistatic conductive portion when the electron injection layer is formed in the manufacturing process of the organic EL device. Thus, advantageous effects similar to those in a case where the cathode conductive layer is disposed on the antistatic conductive portion in the embodiment are obtained. Here, the electron injection layer is described as an example. However, the above descriptions may be similarly applied to a case where the conductive layer is formed on the anode in the manufacturing process of the organic EL device. In a case where the organic functional layer like the light-emitting layer is interposed between the conductive layer and the anode, it is effective to than the conductive layer to be electrically connected to the antistatic conductive portion.

In the above descriptions, the form in which the roller for conveying the substrate with an electrode is used as a grounding member of the antistatic conductive portion is described. However, the grounding member of the antistatic conductive portion is not limited to the roller so long as the member is capable of grounding the antistatic conductive portion. For example, the grounding member may be a conductive bar which is grounded.

An example of manufacturing the organic EL device with the roll-to-roll method while the long support substrate is used is described. However, an organic EL device may be manufactured with a support substrate having a size as large as included in the organic EL device to be manufactured, by a sheet feeding method. In this case, the support substrate (that is, substrate provided in the organic EL device) may not have flexibility.

In the embodiment, the organic EL device as an example of the organic device is described. The present invention can be applied to organic devices such as an organic thin film transistor, an organic photodetector, an organic sensor, and an organic thin film solar cell, in addition to the organic EL device.

REFERENCE SIGNS LIST

10 Organic EL device (organic device)
14 Anode (first electrode)
16 Light-emitting layer (organic functional layer)
18 Cathode (second electrode)
22 Auxiliary electrode
32 Substrate with an electrode
34 Support substrate
34a Surface
36 Antistatic conductive portion
42 Cathode conductive layer (conductive layer)
44 Laminated substrate
DA Device formation area

The invention claimed is:

1. A substrate with an electrode for manufacturing an organic device including a first electrode, a second electrode, and an organic functional layer provided between the first electrode and the second electrode, the substrate with an electrode comprising:
   a support substrate;
   the first electrode provided on an inner side of a device formation area on a surface of the support substrate;
   an antistatic conductive portion provided on an outer side of the device formation area on the surface and electrically connected to the first electrode;
   a connection portion electrically connecting the first electrode and the antistatic conductive portion; and
   wherein the antistatic conductive portion is present only at edge portions along a pair of opposite sides of the support substrate.

2. The substrate with an electrode according to claim 1, further comprising:
   an auxiliary electrode disposed on the surface to be spaced from the first electrode on the inner side of the device formation area and to be electrically connected to the second electrode,
   wherein the auxiliary electrode is electrically connected to the antistatic conductive portion.

3. The substrate with an electrode according to claim 1, wherein the support substrate is a flexible substrate extending in one direction.

4. The substrate with an electrode according to claim 3, wherein the antistatic conductive portion extends in the one direction of the support substrate.

5. The substrate with an electrode according to claim 1, wherein, in a view from a thickness direction of the support substrate, the first electrode and the antistatic conductive portion are formed in different areas on the surface of the support substrate.

6. The substrate with an electrode according to claim 1, wherein, in a view from a thickness direction of the support substrate, the first electrode and the antistatic conductive portion do not have a portion at which the first electrode and the antistatic conductive portion overlap each other.

7. A laminated substrate comprising:
   the substrate with an electrode according to claim 1;
   the organic functional layer provided on the first electrode of the substrate with an electrode; and
   a conductive layer provided on the organic functional layer and electrically connected to the antistatic conductive portion.

8. A manufacturing method of an organic device including the substrate with an electrode according to claim 1, an organic functional layer, and a second electrode, the method comprising:
   a step of forming the organic functional layer on the first electrode of the substrate with an electrode while the substrate with an electrode is conveyed; and
   a step of forming the second electrode on the organic functional layer while the substrate with an electrode is conveyed,
   wherein the substrate with an electrode is conveyed while the antistatic conductive portion is grounded.

9. The manufacturing method of an organic device according to claim 8,
   wherein the antistatic conductive portion is grounded by bringing a roller into contact with the antistatic conductive portion of the substrate with an electrode, the roller having conductivity and being grounded.

* * * * *